US 7,471,178 B2

(12) United States Patent
Koga

(10) Patent No.: US 7,471,178 B2
(45) Date of Patent: Dec. 30, 2008

(54) CURRENT DETECTION DEVICE

(75) Inventor: Akihiro Koga, Iruma (JP)

(73) Assignee: Toko Inc., Tokyo-To (JP)

( * ) Notice: Subject to any disclaimer, the term of this patent is extended or adjusted under 35 U.S.C. 154(b) by 66 days.

(21) Appl. No.: 11/788,055

(22) Filed: Apr. 19, 2007

(65) Prior Publication Data

US 2007/0247135 A1    Oct. 25, 2007

(30) Foreign Application Priority Data

Apr. 21, 2006   (JP)   ............................. 2006-117564

(51) Int. Cl.
*H01F 27/02*   (2006.01)
(52) U.S. Cl. ....................................... 336/90
(58) Field of Classification Search ................... 336/65, 336/83, 90, 92, 178, 225, 229; 324/117 R, 324/117 H
See application file for complete search history.

(56) References Cited

U.S. PATENT DOCUMENTS

| 4,639,665 | A | * | 1/1987 | Gary | ....................... | 324/117 H |
| 5,241,263 | A | * | 8/1993 | Naoi et al. | ............... | 324/117 H |
| 6,040,688 | A | | 3/2000 | Strubin | ....................... | 323/368 |
| 7,250,749 | B2 | * | 7/2007 | Itoh | ....................... | 324/117 H |
| 2002/0145416 | A1 | | 10/2002 | Attarian et al. | ............. | 324/127 |
| 2004/0145929 | A1 | | 7/2004 | Mihara et al. | .................. | 363/98 |

FOREIGN PATENT DOCUMENTS

| DE | 298 18 370 | 1/1998 | .................... | 15/20 |
| EP | 1 450 166 | 11/2002 | .................... | 15/20 |
| GB | 871867 | 11/1957 | | |
| JP | 2002-181851 | 6/2002 | .................... | 15/20 |

OTHER PUBLICATIONS

Hall Effect Measurement of Real and Reactive Power In a Faraday Machines Laboratory (May 1980).
Telemetered Line Losses to Aid Dispatching (Jan. 1970).
European Search Report (Jan. 30, 2008).

* cited by examiner

*Primary Examiner*—Tuyen T. Nguyen
(74) *Attorney, Agent, or Firm*—Renner, Kenner, Greive, Bobak, Taylor & Weber

(57) ABSTRACT

The present invention provides a low-cost current detection device having a magnetic sensor easily placed on a choke coil, wherein assembly and manufacturing costs are reduced and a product is miniaturized. A current detection device including a choke coil for smoothing an input current or an output current and a magnetic sensor 1a built into the choke coil to detect the input current or output current, wherein the choke coil is composed of: a pair of cores 5 provided with an outer magnetic leg 5a constituting a closed magnetic circuit and a center magnetic leg 5b for providing a gap; and an air core coil 6 mounted on the center magnetic leg 5b, and space 6b is provided to a part of winding of the air core coil 6 with the magnetic sensor 1a placed in the gap between the space 6b and the center magnetic leg 5b.

6 Claims, 2 Drawing Sheets

CURRENT DETECTION DEVICE

BACKGROUND OF THE INVENTION

1. Field of the Invention

The present invention relates to a current detection device, and in particular, to a current detection device having a magnetic sensor built into a choke coil.

2. Related Art

A current control device generally feeds back a detection signal obtained from a detection circuit to a control circuit for the sake of stabilization by means of a detection circuit having a sensing resistor for detecting a current or voltage connected in series with a load on an output side thereof in order to exert constant voltage and constant current control. This method has significant power attenuation because a current is constantly passed to the sensing resistor, which causes a serious problem to a power circuit for passing a high current, such as a resistance change due to heat generation of the sensing resistor.

As means for solving this problem, there is a current detection device conventionally known, which is provided with a choke coil for smoothing an input current or an output current and a magnetic sensor such as a Hall element as current detection means inside the choke coil.

FIG. 1 is a general current control circuit diagram which uses a current detection device having a magnetic sensor built into a choke coil. In FIG. 1, reference numeral 1 denotes a current detection device having a magnetic sensor 1a built into a choke coil, 2 denotes a switching element, 3 denotes a control circuit, and 4 denotes a load such as a motor. Thus, the current detection device 1 having the magnetic sensor 1a built into the choke coil detects a magnetic flux generated by the current passing through the choke coil with the magnetic sensor 1a, and performs a voltage amplification process and the like to output a signal voltage proportional to the current to the control circuit.

Circuit configuration of the current control circuit is widely known, and so a detailed description of the circuit will be omitted. As for the magnetic sensor 1a, it uses a Hall IC having a Hall element, a voltage amplifier circuit and the like built therein.

FIG. 4 is a sectional view of the current detection device 1. As shown in FIG. 4, the choke coil is composed of a choke core on which winding is performed. The choke coil is a closed magnetic circuit combining an E-shaped core 11 with an I-shaped core 12, where a wound coil 13 is implemented on a center magnetic leg 11a of the E-shaped core 11, and a gap 15 is provided between an end of the center magnetic leg 11a and the I-shaped core 12.

The gap 15 is intended to prevent the choke coil from losing its function as a choke coil as the coil 13 becomes saturated with a high current passing through it, rapidly decreasing inductance of the choke coil. The magnetic sensor 1a is placed in the gap 15 to detect a magnetic flux which penetrates between the center magnetic leg 11a and the I-shaped core 12 according to the current passing through the choke coil. It is thereby possible to obtain a control signal (refer to Patent Document 1).

[Patent Document 1] Japanese Patent Laid-Open No. 2002-181851

[Patent Document 1] Japanese Patent Laid-Open No. 2001-194392

As for the above current detection device, placement of the magnetic sensor and the core is important in order to accurately detect the magnetic flux according to the current passing through the choke coil with the magnetic sensor. Especially, it is an important problem, for the sake of improving detection accuracy of the current detection device, to place the magnetic sensor 1a in the gap 15 between the center magnetic leg 11a of the E-shaped core 11 and the I-shaped core 12.

The present invention has been made in view of the problem, and an object thereof is to provide a low-cost current detection device having the magnetic sensor easily placed on the choke coil for the purposes of reducing assembly and manufacturing costs and miniaturizing the product.

SUMMARY OF THE INVENTION

To solve the problem, the present invention provides a current detection device including a choke coil for smoothing an input current or an output current and a magnetic sensor built into the choke coil to detect the input current or output current, wherein the choke coil is composed of: a pair of cores provided with an outer magnetic leg constituting a closed magnetic circuit and a center magnetic leg for providing a gap; and a coreless coil mounted on the center magnetic leg; and a space is provided to a part of winding of the coreless coil with the magnetic sensor inserted and placed into the gap of the center magnetic leg from the space.

The coreless coil uses a rectangular wire which is an insulated copper line with a square cross section. The pair of cores uses EE cores or EP cores made of a ferrite material. To secure insulation of the coreless coil and cores, a frame made of an insulating resin is provided to be mounted on a core's inner circumference portion. The magnetic sensor uses a Hall IC composed of a Hall element.

Furthermore, a base for fixing the choke coil and the magnetic sensor is provided, and a metal case including a terminal for housing the choke coil is provided to reinforce fixation with a mounting board.

The current detection device of the present invention is composed of a pair of cores provided with an outer magnetic leg constituting a closed magnetic circuit on the choke coil and a center magnetic leg for providing a gap and an a coreless coil mounted on the center magnetic leg. And a space is provided to a part of winding of the coreless coil so that the magnetic sensor can be easily mounted and placed in the gap between the space portion and the center magnetic leg. The magnetic sensor uses a Hall IC composed of a Hall element so that the number of parts can be reduced, circuits can be simplified and miniaturization and lower cost can be realized.

The frame made of an insulating resin is provided and mounted on a core's inner circumference portion for wrapping the center magnetic leg so as to secure insulation of the coreless coil and cores. And a concave portion for placing the magnetic sensor is provided to the frame so as to facilitate positioning and lessen characteristic variations in mass production.

It is also possible, by providing the base and metal case, to reinforce implementation on a circuit board so as to provide a highly-reliable current detection device capable of withstanding a vibration impact and the like, wherein assembly and manufacturing costs are reduced and the product is miniaturized.

DETAILED DESCRIPTION OF THE INVENTION

Hereafter, a current detection device according to the present invention will be described more specifically with reference to FIGS. 1 to 3.

Figure 1:
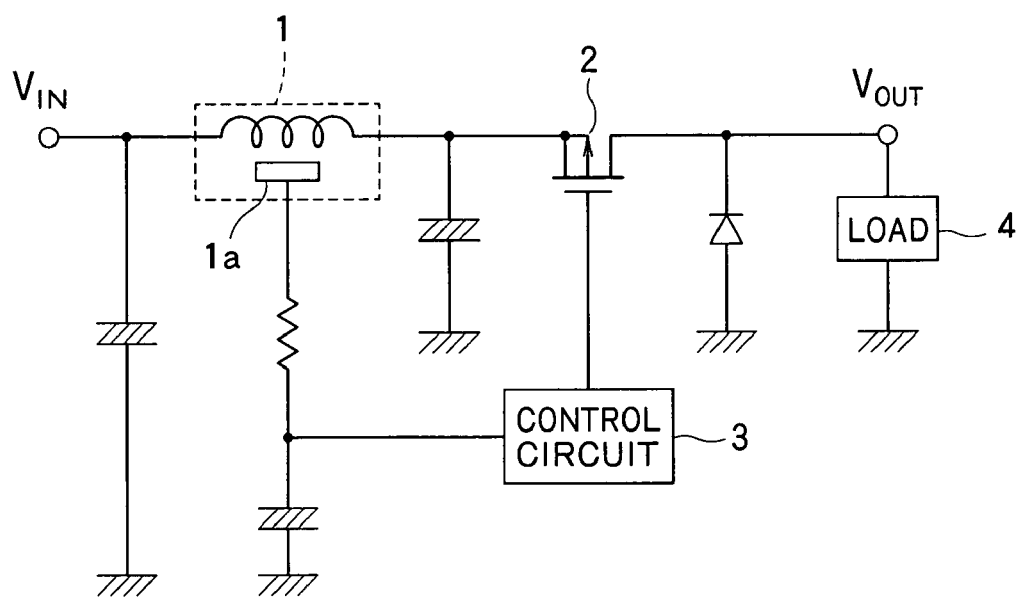
FIG. 1 is a circuit diagram showing a current control circuit which uses a general current detection device.

FIG. 1 shows a general current control circuit which uses a current detection device having a magnetic sensor built into a choke coil. In FIG. 1, reference numeral 1 denotes a current detection device having a magnetic sensor 1a built into a choke coil, 2 denotes a switching element, 3 denotes a control circuit, and 4 denotes a load such as a motor.

Thus, the current detection device having the magnetic sensor 1a built into the choke coil detects a magnetic flux generated by the current passing through the choke coil with the magnetic sensor 1a, and outputs a signal voltage proportional to the current to the control circuit by means of an additional circuit for voltage amplification or the like. The magnetic sensor 1a uses a Hall IC having a Hall element and another circuit such as an amplifier circuit incorporated therein so that the number of parts can be reduced and circuits can be simplified, which is effective for miniaturization. The circuit configuration of the current control circuit is widely known, and so a detailed description of the circuit will be omitted.

Operation of the current control circuit of FIG. 1 is as follows. An input voltage Vin becomes a repetitive waveform in which the current passing through a choke coil 1 is changed as the switching element turns on and off. The Hall IC 1a outputs a voltage according to a change in the magnetic flux which penetrates a gap (between a center magnetic legs 5b) of cores 5, and smoothes an output voltage with an integration circuit configured by a capacitor and a resistor to give it to the control circuit thereafter and thereby control an output voltage Vout. The Hall IC 1a detects the magnetic flux according to the repetitive waveform wherein the current passing through a choke coil 1 is changed.

The current detection device was used for the current control circuit in the embodiment. As a matter of course, the present invention is also applicable to other forms, such as a switching supply and a DC-to-DC converter including a choke coil for smoothing an input current or an output current.

Next, the current detection device using the magnetic sensor will be described with reference to FIGS. 2 and 3. FIG. 2 is a schematic sectional view for describing the current detection device which is an embodiment of the present invention. FIG. 3 shows an exploded perspective view thereof.

Figure 2A:
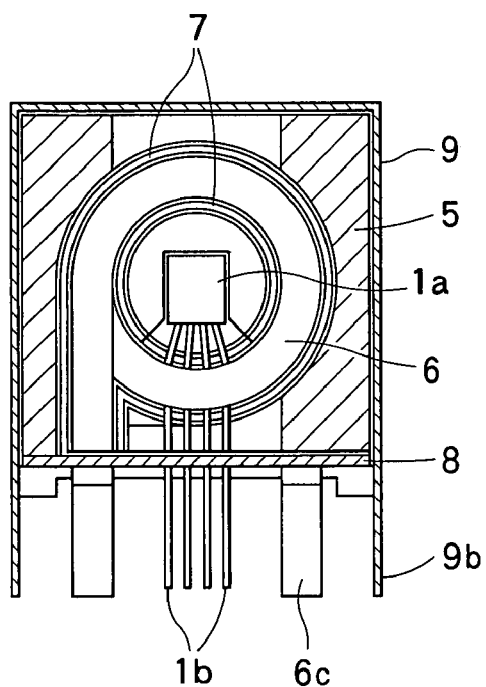
FIG. 2 is a sectional view for describing the current detection device which is an embodiment of the present invention.
Figure 2B:
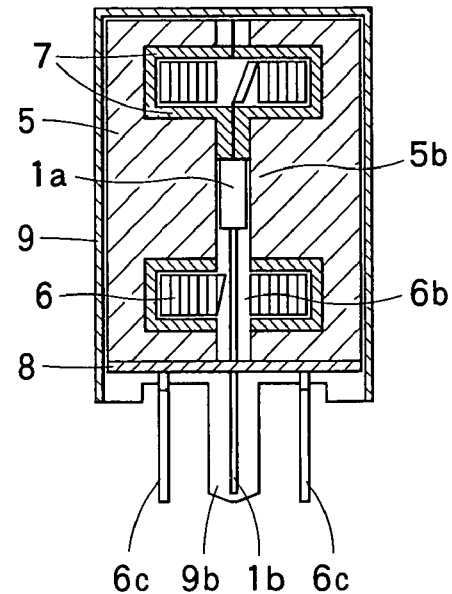
Figure 3:
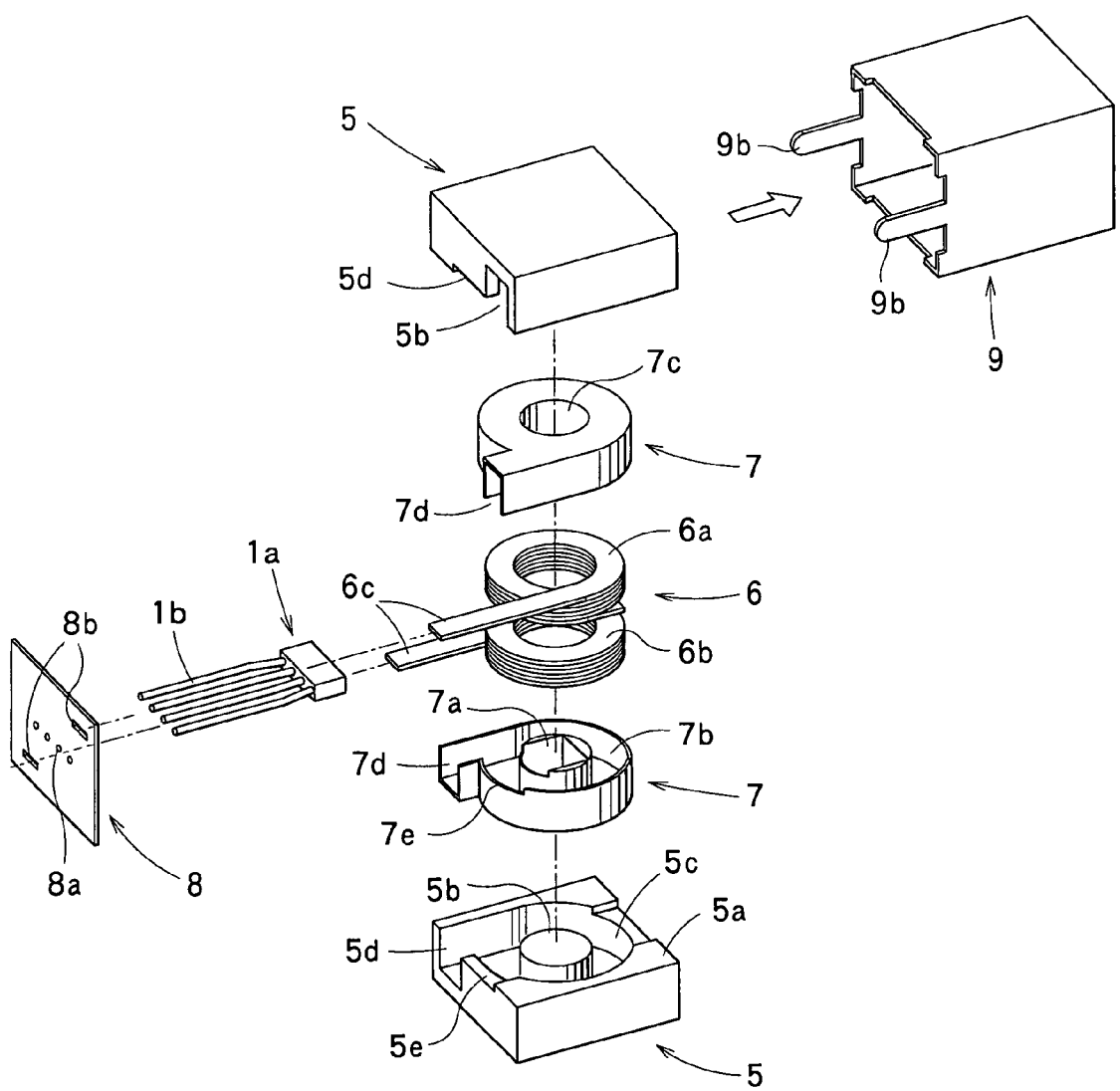
FIG. 3 is an exploded perspective view of the current detection device which is an embodiment of the present invention.
Figure 4:
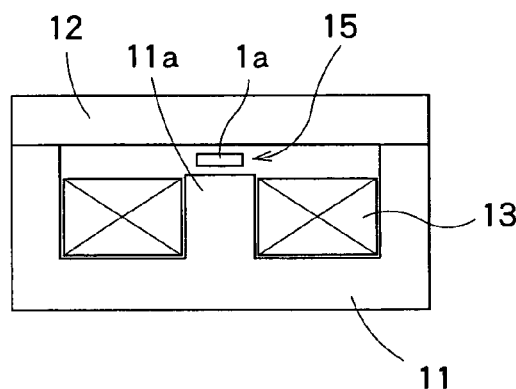
FIG. 4 is a diagram showing an arrangement of a current sensor of a conventional current detection device.

In FIGS. 2 and 3, reference numeral 1a denotes a magnetic sensor, 5 denotes a core made of ferrite, 6 denotes a coreless coil forming a coil, 7 denotes a frame, 8 denotes a base, and 9 denotes a current detection device composed of a metal case. This embodiment used a Hall IC including a Hall element and an amplifier circuit for amplifying an output signal thereof as the magnetic sensor, which is a four-terminal model of model number MLX90251 of Melexls for instance.

Here, a pair of cores 5 which become the choke coil is provided with an outer magnetic leg 5a constituting a closed magnetic circuit on an outer circumference of the core and a center magnetic leg 5b at its center. The core 5 is a so-called EP core with its one side open, which is provided with a space 5c for housing the coreless coil 6, a concave portion 5d for pulling out a terminal 6c of the coreless coil, and a concave portion 5e for pulling out a terminal 1b of the magnetic sensor on one side (equivalent to a bottom side) of the outer magnetic leg.

The center magnetic leg 5b is provided with a gap for rendering it shorter than the outer magnetic leg 5a to improve magnetic saturation (DC superimposition characteristic). The magnetic sensor 1a is placed in the gap (inside the diameter of the center magnetic leg 5b). Although the EP core was used as the core 5, an EE core may also be used.

The coreless coil 6 is a copper line with a square cross section edgewise-wound by using a rectangular wire which is covered by an insulation coating. A space 6b for inserting the magnetic sensor 1a is provided at the center of the winding. The space 6b has a clearance which should be about as thick as the magnetic sensor to allow the magnetic sensor to be inserted. The space 6b should be located in a gap position according to length of the center magnetic leg of the winding and the winding number so as to be effective in terms of operation. It does not always have to be the center.

Although the rectangular wire was used for the coreless coil 6 in the embodiment, it is also possible to use an insulation coating conductor of which cross section is circular. There is a tendency that area occupied by the winding becomes large in comparison with the rectangular wire and the shape becomes large so that the core also requires the space 5c of a storage portion according to that tendency.

The frame 7 is made of an insulating resin for securing insulation of the coreless coil 6 and the cores 5, and houses the center magnetic leg 5b of the core 5 in a concave portion 7c to mount it on a core's inner circumference portion (the space 5c). And a concave portion 7a for housing the magnetic sensor 1a is provided at a portion equivalent to the end (inside the diameter) of the center magnetic leg 5b. It is also provided with a concave portion 7d for pulling out an end 6c which is the terminal of the coreless coil 6 and a notch portion 7e for pulling out a terminal 1b of the magnetic sensor 1a.

Thus, the frame has insulation of the coreless coil 6 and the cores 5 secured and is provided with the concave portion 7a for positioning the magnetic sensor 1a so that it can be placed in a location where the magnetic flux of the gap of the center magnetic leg is even. Thus, it is possible to prevent a displacement and lessen characteristic variations in mass production.

The base 8 is a thin square base using an insulating and heat-resisting resin, and is provided with a hole 8b for pulling out the end 6c which is the terminal of the coreless coil 6, and a hole 8a for pulling out the magnetic sensor 1a and 1b in order to fix the coreless coil 6 and the magnetic sensor 1a.

It is also possible to use a general circuit board for the base 8, form a circuit pattern on a top face or an underside thereof and render it as a part of circuit formation or fix the terminal of the careless coil or the terminal of the magnetic sensor thereon by soldering.

It is also possible to use a general circuit board for the base 8, form a circuit pattern on a top face or an underside thereof and render it as a part of circuit formation or fix the terminal of the air core coil or the terminal of the magnetic sensor thereon by soldering.

The metal case 9 is intended to fix a terminal 9b of the metal case on a mounting board in consideration of a vibration impact and the like for vehicle installation and the like. In the case of not considering the vibration impact and the like, it is not necessary to use the metal case.

Next, an assembling method of the current detection device of the present invention will be described.

(1) First, the frame 7 is mounted on each of the pair of cores 5 according to the forms of the center magnetic leg 5b and the core's inner circumference. For the sake of reinforcement, an adhesive may be used between the core 5 (the inner circumference portion or the center magnetic leg) and the frame 7 to fix them.

(2) Next, a central portion 6a of the coreless coil 6 is inserted into the portion equivalent to the center magnetic leg of the pair of cores 5 having the frames mounted thereon, and an arrangement is made so that the terminals 6c and 6c of the coreless coil pass through the concave portions 7d and 7d of the frames 7 to engage the cores 5 and 5. In this case, it is also possible to fix them by applying the adhesive to the open face of the outer magnetic leg 5a.

(3) Next, the magnetic sensor 1a is inserted into the core having the coreless coil housed therein from a notch portion 5e of the core 5 and the notch portion 7e of the frame 7, and is housed in the concave portion 7a (gap portion of an opposed center magnetic leg) through the space 6b of the coreless coil 6. In this case, it is also possible to fix the magnetic sensor by applying the adhesive to the outer circumference thereof.

(4) The ends 6c of the coreless coil 6 and the terminal 1b of the magnetic sensor are passed through predetermined holes 8a, 8b so as to fix the base 8 and the core bottom side (5d and 5e side) by using the adhesive. As for the base 8, it is also possible to use a general circuit board, form a circuit pattern on the top face or the underside thereof and render it as a part of circuit formation or fix the terminal of the coreless coil or the terminal of the magnetic sensor thereon by soldering.

(5) Lastly, assembled cores are housed in the metal case 9, and are fixed by using the adhesive. An application position of the adhesive is the case's inner circumference portion or the core's outer circumference portion.

As described above, the current detection device of the present invention can secure the insulation of the coreless coil and cores by providing a space to a part of the winding of the coreless coil and providing the frame mounted on the core's inner circumference portion so that the magnetic sensor can be easily mounted and placed in a location where the magnetic flux of the gap of the center magnetic leg is even. Thus, it is possible to prevent a displacement and lessen characteristic variations in mass production. And the magnetic sensor can use a Hall IC composed of a Hall element so that the number of parts can be reduced, circuits can be simplified and miniaturization and lower cost can be realized.

It is also possible, by providing the base and metal case, to reinforce fixation on a mounting board so as to obtain a highly-reliable current detection device capable of withstanding a vibration impact and the like, wherein assembly and manufacturing costs are reduced and the product is miniaturized.

What is claimed is:

1. A current detection device including a choke coil (1) for smoothing an input current or an output current and a magnetic sensor (1a) built into the choke coil to detect the input current or output current, wherein
   the choke coil (1) is composed of:
   a pair of cores (5) provided with an outer magnetic leg (5a) constituting a closed magnetic circuit and a center magnetic leg (5b) for forming a gap;
   a coreless coil (6) having a space (6b) at the intermediate portion; and a pair of frames (7) having a first concave portion (7c) for housing the center magnetic leg (5b), a second concave portion (7a) for housing the magnetic sensor (1a) and a third concave portion (7b) for housing the coreless coil (6).

2. The current detection device according to claim 1, wherein the coreless coil uses a rectangular wire which is an insulated copper line with a square cross section.

3. The current detection device according to claim 1, wherein a frame made of an insulating resin is provided on a core's inner circumference portion for wrapping the center magnetic leg in order to secure insulation of the coreless coil and core.

4. The current detection device according to claim 1, wherein the magnetic sensor uses a Hall IC composed of a Hall element.

5. The current detection device according to claim 1, wherein a base for fixing the coreless coil and the magnetic sensor is provided.

6. The current detection device according to claim 1, wherein a metal case including an external terminal for housing the choke coil is provided in order to reinforce fixation of an external circuit board.

* * * * *